United States Patent [19]
Mead

[11] Patent Number: 5,095,284
[45] Date of Patent: Mar. 10, 1992

[54] SUBTHRESHOLD CMOS AMPLIFIER WITH WIDE INPUT VOLTAGE RANGE

[75] Inventor: Carver A. Mead, Pasadena, Calif.

[73] Assignee: Synaptics, Incorporated, San Jose, Calif.

[21] Appl. No.: 580,376

[22] Filed: Sep. 10, 1990

[51] Int. Cl.$^5$ ............................................. H03F 3/45
[52] U.S. Cl. ................................ 330/253; 330/257; 330/277; 330/300
[58] Field of Search ............... 330/253, 257, 277, 283, 330/300

[56] References Cited
FOREIGN PATENT DOCUMENTS
145914 7/1986 Japan .................................. 330/277

Primary Examiner—James B. Mullins
Attorney, Agent, or Firm—Kenneth D'Alessandro

[57] ABSTRACT

A first linear voltage to current converter includes an MOS current source transistor with its gate connected to a source of fixed voltage, used to feed the source of an MOS follower transistor. A second linear voltage to current converter includes a bipolar current source transistor with its base connected to a source of fixed voltage, used to feed the source of an MOS follower transistor. A differential pair includes in each leg a bipolar current source transistor with its base connected to a source of fixed voltage feeding the source of an MOS follower transistor. A differential amplifer includes two circuit legs including these transistor circuits.

23 Claims, 4 Drawing Sheets

SUBTHRESHOLD CMOS AMPLIFIER WITH WIDE INPUT VOLTAGE RANGE

BACKGROUND OF THE INVENTION

1. Field Of The Invention

The present invention relates to analog integrated circuits. More particularly, the present invention relates to MOS and MOS/bipolar amplifier circuits.

2. The Prior Art

It has recently become apparent that large scale analog circuits can be achieved using conventional CMOS technology. The key to achieving very high levels of complexity in an analog system is to operate the individual transistors in their subthreshold region, where the drain current is an exponential function of the gate-source voltage. In this regime of operation, amplifiers can be operated with current levels in the range from $10^{-12}$ A to $10^{-7}$ A. At these low currents, the drain current of the individual transistors saturates at drain voltages above 100 to 200 Mv, allowing analog operation with the same power-supply voltages commonly employed for digital circuits (0–5 V in 1988). Because of the low power-supply voltage and low current level, the total power dissipated by an individual amplifier is extremely small, making possible large-scale systems employing $10^4$ or more amplifiers.

Despite the numerous advantages of subthreshold operation, very few systems outside of the electronic watch industry have taken advantage of this mode of operation. The major problems that have prevented application of subthreshold amplifiers have been their input offset voltage and the limited input voltage range.

Previous circuits are known for converting an input voltage to an output current. Such a circuit, shown in FIG. 1a, is described in the book *Analog VLSI and Neural Systems* by Carver Mead, Addison-Wesely Publishing Co. 1989, at page 70. The output current of the circuit of FIG. 1a is plotted as a function of the differential input voltage in FIG. 1b. As may be seen from FIG. 1b the current is a linear function of the differential input voltage over only a small portion (about 100 mV) of the input range. The advantages of a circuit which can produce an output current which is a linear function of its input voltage over a wider range of input voltages are obvious.

One prior art approach to providing such a circuit is described in U.S. Pat. No. 4,935,702 to Mead et al., assigned to the same assignee as the present invention. This patent discloses a circuit which utilizes a capacitive voltage divider to extend the range over which the output current is a linear function of the input voltage. The approach to extending input voltage range used in this prior invention limited the signal excursion seen by the input transistors of the amplifier to the approximately 100 mV allowed by the technology. However, by reducing the input voltage excursion, the signal-to-noise ratio of the amplifier is inevitably degraded.

It is thus an object of the present invention to provide a circuit whose output current is a linear function of its input voltage over a major portion of the power supply range without degrading the signal-to-noise ratio.

BRIEF DESCRIPTION OF THE INVENTION

The present invention describes a subthreshold amplifier stage with very linear response over a wide input voltage range, which is accomplished without degrading the signal-to-noise ratio.

In a first aspect of the present invention, an MOS current source transistor with its gate connected to a source of fixed voltage is used to feed the source of an MOS follower transistor. The output current of the circuit is taken at the drain of the follower transistor.

In a second aspect of the present invention, a bipolar current source transistor with its base connected to a source of fixed voltage is used to feed the source of an MOS follower transistor. The output current of the circuit is taken at the drain of the follower transistor.

In a third aspect of the present invention, a differential pair includes in each leg a bipolar current source transistor with its base connected to a source of fixed voltage feeding the source of an MOS follower transistor. The differential output currents of the circuit are taken at the drains of the follower transistors.

In a fourth aspect of the present invention, a differential amplifier and differential amplifier with extended output voltage range include in each leg a bipolar current source transistor with its base connected to a source of fixed voltage feeding the source of an MOS follower transistor. The differential output currents of the circuit are taken at the drains of the follower transistors.

BRIEF DESCRIPTION OF THE DRAWINGS

FIG. 1b is a graph showing the I-V characteristics of the circuit of FIG. 1a.

DETAILED DESCRIPTION OF A PREFERRED EMBODIMENT

The transfer functions of the circuits disclosed herein are nearly linear, i.e., within about 10%, over a wide range of input voltage which, if the MOS transistors are operated in a subthreshold condition, is almost coextensive (within a few hundred millivolts) with the range of the power supplies used. The above-described behavior of the circuits disclosed herein will be referred to in the specification and claims herein as "linear".

Figure 1A:
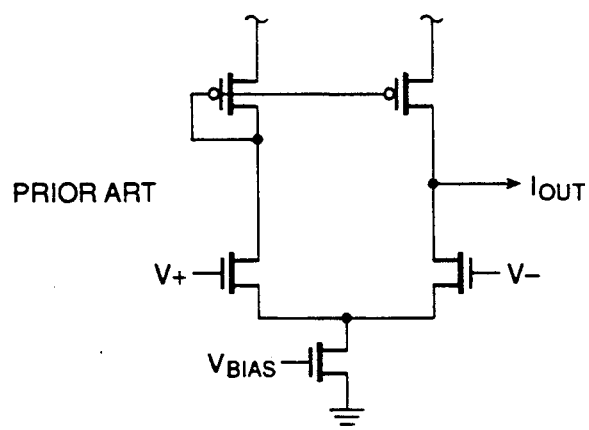
FIG. 1a is a schematic diagram of a prior art voltage to current converting circuit.
Figure 1B:
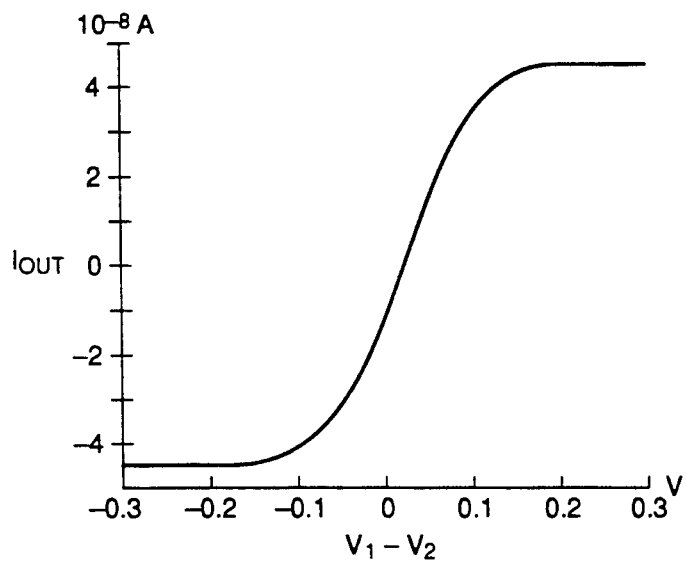
Figure 2:
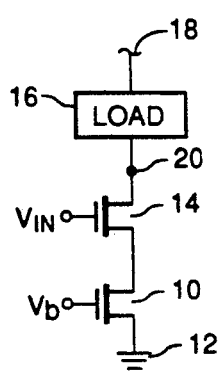
FIG. 2 is a schematic diagram of an embodiment of the present invention utilizing two MOS transistors.

Referring now to FIG. 2, MOS N-channel current source transistor 10 has its gate connected to a source of fixed bias voltage $V_b$, its source connected to a common voltage node 12 shown as ground in FIG. 2, and its drain connected to the source of MOS N-channel follower transistor 14. The common voltage node 12 can be ground, or can be another voltage derived from other circuitry. MOS N-channel follower transistor 14 has its drain connected to a load 16 and its gate connected to the input voltage $V_{in}$. The other end of load 16 is returned to a source of fixed voltage 18. Suitable loads for the circuits disclosed herein include diode-connected or current-mirror connected P- or N-channel MOS transistors, diode-connected or current-mirror connected PNP or NPN bipolar transistors, linear resistors or other devices for converting a current into a voltage.

If MOS N-channel current source transistor 10 were a perfect current source, the output current I at drain node 20 of transistor 14 would be independent of the input voltage $V_{in}$ as long as current source transistor 10 is saturated. However, in its saturation region, the drain current of a real transistor is a nearly-linear function of its drain voltage, because of the shortening of the channel or base region due to expansion of the drain or collector depletion layer (the well-known Early effect). The present invention uses the Early effect of the current-source transistors to create a broad and nearly-linear dependence of the output current on the input voltage.

Figure 4:
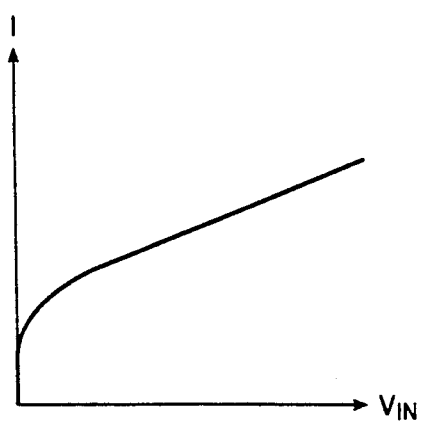
FIG. 4 is a graph of the behavior of the circuit of FIGS. 2 and 3, showing output current I as a function of input voltage $V_{in}$.

The circuit of FIG. 2 operates as follows: MOS N-channel current source transistor 10 supplies a current set by its gate voltage $V_b$. This current acts as a source current for MOS N-channel follower transistor 14. By the follower action of MOS N-channel follower transistor 14, the drain of MOS N-channel current-source transistor 10 will follow below input voltage $V_{in}$ by a nearly-constant gate-source voltage required by the source current. For threshold voltages encountered in typical CMOS processes, MOS follower transistor 14 will be saturated as long as its drain voltage is higher than the input voltage $V_{in}$. Thus, as the input voltage is increased, the drain voltage on MOS N-channel current source transistor 10 will increase, and thus the output current I at node 20 will increase due to the Early effect. Hence the output current I is a nearly-linear function of the input voltage $V_{in}$, as depicted in FIG. 4. This circuit may be thought of as the converse of the well-known cascode connection, in which two transistors are also series connected. In the cascode circuit, the input is applied to the gate of the lower transistor, and the gate of the upper transistor is held at a fixed voltage to reduce the amount by which the Early effect changes the output current. In the present invention, the input voltage is applied to the gate of the upper transistor to make use of the amount by which the Early effect changes the drain current of the lower transistor.

Figure 3:
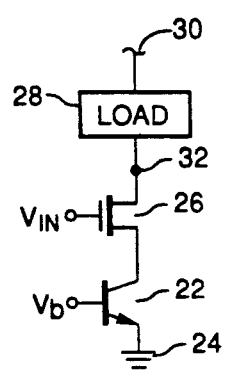
FIG. 3, is a schematic circuit of a presently preferred embodiment of the present invention using a lateral bipolar transistor.

Referring now to FIG. 3, a presently preferred embodiment of the present invention includes lateral NPN current source transistor 22 having its base connected to a source of fixed bias voltage $V_b$, its emitter connected to a common voltage node 24 shown as ground in FIG. 3, and its collector connected to the source of MOS N-channel follower transistor 26. Like the embodiment of FIG. 2, the common voltage node 24 can be ground, or can be another voltage derived from other circuitry. All common voltage nodes referred to herein with respect to the various embodiments disclosed herein may be either derived or fixed voltages.

The gate of MOS N-channel follower transistor 26 is connected to the input voltage $V_{in}$ and its drain is connected to a load 28. The other end of load 28 is returned to a second source of fixed voltage 30.

Lateral bipolar transistors such as transistor 22 have less noise in their drain currents than MOS transistors, and can be designed to have a quite large Early effect. In fact the large Early effect has limited the use of these devices in MOS circuits. For the present invention, however, the large Early effect is an advantage, because it increases the transconductance of the overall circuit ($di/dv_{in}$). Because of the low noise and excellent matching of bipolar transistors manufactured in a CMOS process, the output current I at drain node 32 of transistor 26 will have its noise determined primarily by the voltage noise of the input MOS transistor 26. This noise is reduced by the same factor as the input signal, and therefore the overall circuit will have the same noise level as a normal MOS input stage, but greatly expanded dynamic range.

The circuit of FIG. 3 operates in much the same manner as the circuit of FIG. 2. Lateral NPN current source transistor 22 supplies a current set by its base voltage. This current acts as a source current for MOS N-channel follower transistor 26. By the follower action of MOS N-channel follower transistor 22, the collector node 34 of Lateral NPN current-source transistor 22 will follow below input voltage $V_{in}$ by a nearly-constant voltage required by the source current. Thus as the input voltage is increased, the collector voltage (at node 34) on lateral NPN current source transistor 22 will increase, and thus the output current I will increase due to the Early effect. Hence the output current I is a nearly-linear function of the input voltage $V_{in}$, as depicted in FIG. 4.

Figure 5:
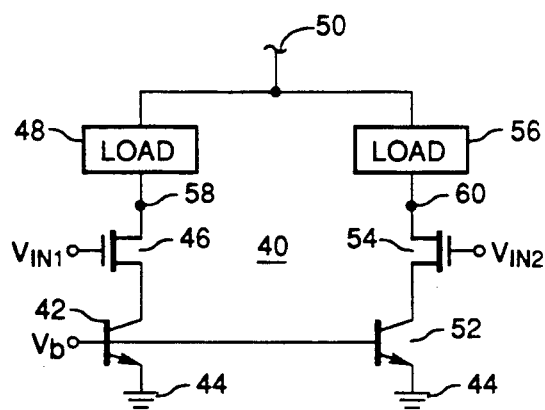
FIG. 5 is a schematic diagram showing a differential pair constructed of two of the circuits of FIG. 3.

Referring now to FIG. 5, a differential pair 40 constructed of two of the circuits of FIG. 3 includes a first lateral NPN current source transistor 42 having its base connected to a source of fixed bias voltage $V_b$, its emitter connected to a common voltage node 44 shown as ground in FIG. 3, and its collector connected to the source of first MOS N-channel follower transistor 46. The gate of first MOS N-channel follower transistor 46 is connected to a first input voltage $V_{in1}$ and its drain is connected to a first load 48 at first node 58. The other end of first load 48 is returned to a source of fixed voltage 50.

Second lateral NPN current source transistor 52 has its base connected to the same source of fixed bias voltage $V_b$, its emitter connected to common voltage node 44, and its collector connected to the source of second MOS N-channel follower transistor 54. The gate of second MOS N-channel follower transistor 54 is connected to a second input voltage $V_{in2}$ and its drain is connected to a second load 56 at second node 60. The other end of second load 56 is returned to fixed voltage source 50. The drain voltages of the follower transistors are held in saturation by the action of the loads.

The output currents $I_1$ and $I_2$ at nodes 58 and 60, respectively, can be used in any circuit where the outputs of a normal differential pair can be utilized, with a greatly expanded dynamic range of differential input voltages ($V_{in1} - V_{in2}$).

Figure 6:
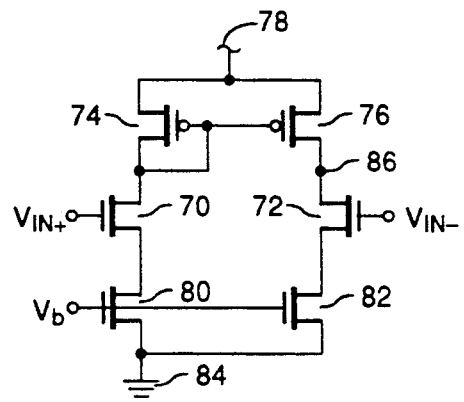
FIG. 6 is a schematic diagram of a first embodiment of a differential transconductance amplifier according to the present invention.

Referring now to FIG. 6, a first embodiment of a linear differential voltage to current converter incorporating the embodiment of the present invention illustrated in FIG. 2 includes a first N-channel input transistor 70 and a second N-channel input transistor 72, having their gates connected to non-inverting and inverting input voltage nodes $V_{in+}$ and $V_{in-}$ respectively, and having their drains connected to the drains of current mirror connected P-channel transistors 74 and 76, respectively. The sources of current mirror connected P-channel transistors 74 and 76 are commonly connected to a fixed voltage source 78, shown symbolically as a voltage rail in FIG. 6. The commonly connected gates of transistors 74 and 76 are connected to the drain of transistor 70. N-channel bias transistors 80 and 82 have their drains connected to the sources of input transistors 70 and 72, respectively. The sources of N-channel bias transistors 80 and 82 are commonly connected to a common voltage node 84 (shown as ground) negative with respect to the first voltage source. The gates of N-channel bias transistors 80 and 82 are shown commonly connected to a source of fixed bias voltage $V_b$.

The circuit of FIG. 6 utilizes the Early effect of N-channel bias transistors 80 and 82. The current output is taken at the node 86 formed by the common drain connections of transistors 72 and 76.

Figure 7:
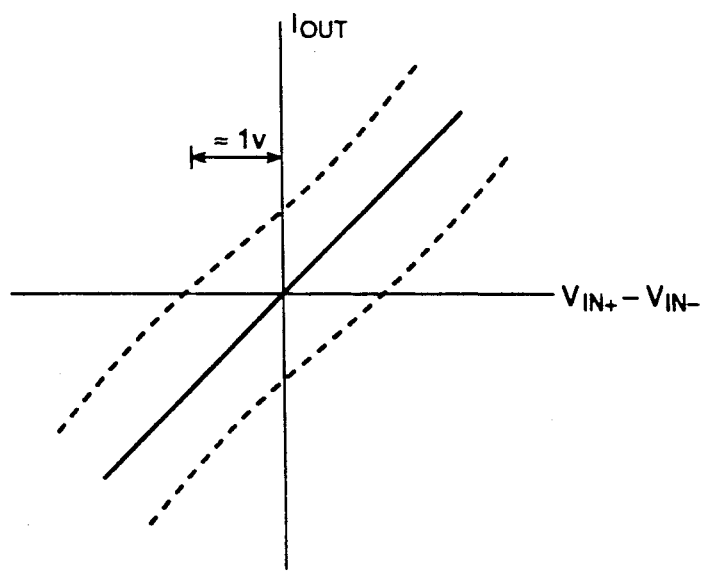
FIG. 7 is a graph of output current produced by the circuit of FIG. 6 as a function of differential input voltage, showing the range of offset produced by the circuit.

FIG. 7 is a graph of the current output of the circuit of FIG. 6 as a function of the differential input voltage. The solid line represents the ideal transfer curve and can be seen to be a linear function of the differential input voltage. The circuit of FIG. 6 is limited by the matching between the current source transistors. As is well known in the art, MOS devices, particularly when operated in their subthreshold region, are not particularly well matched, and the actual linear output transfer characteristic may lie anywhere between the two dashed lines of FIG. 7, resulting in up to 1 volt input offset voltage for a typical 20 Mv offset between the two input transistors 70 and 72.

Figure 8:
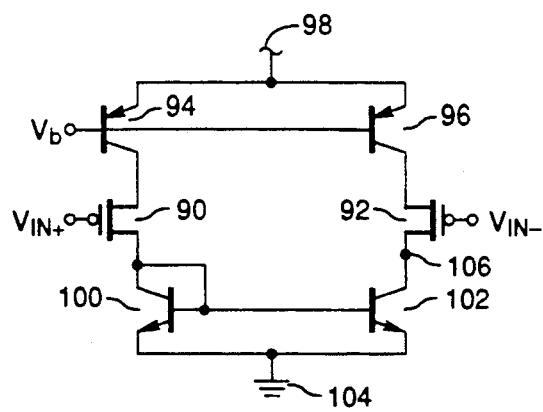
FIG. 8 is a schematic diagram of a presently preferred embodiment of a differential transconductance amplifier according to the present invention.

This offset voltage can be greatly reduced using a presently preferred embodiment of a differential amplifier according to the present invention. This embodiment is shown in FIG. 8. The circuit of FIG. 8 produces an output current linearly dependent on differential input voltage of its two inputs. P-channel input transistors 90 and 92 have their gates connected to non-inverting and inverting input voltage nodes $V_{in+}$ and $V_{in-}$ respectively, and have their sources connected to the collectors of PNP bias transistors 94 and 96. PNP bias transistors 94 and 96 are preferably lateral PNP transistors, which have a larger Early effect. The emitters of bias transistors 94 and 96 are commonly connected to a common voltage node 98, shown symbolically in FIG. 8 as a voltage rail, although those of ordinary skill in the art will understand that it may be a derived voltage. The bases of PNP bias transistors 94 and 96 are commonly connected to a source of fixed bias voltage $V_b$.

The drains of P-channel input transistors 90 and 92 are connected to the collectors of current mirror connected NPN transistors 100 and 102. The emitters of transistors 100 and 102 are connected to a fixed voltage source 104 (shown as ground) negative with respect to the common voltage node 98. The bases of transistors 100 and 102 are connected to the drain of P-channel input transistor 90.

The output current of the circuit of FIG. 8 is taken from the node 106 formed by the common connection of the drain of P-channel input transistor 92 and NPN transistor 102. It should be noted that the P-channel carrier type is shown in FIG. 8 because, in a typical CMOS process, the noise level in a P-channel MOS transistor is lower than that of a similar N-channel MOS transistor.

Figure 9:
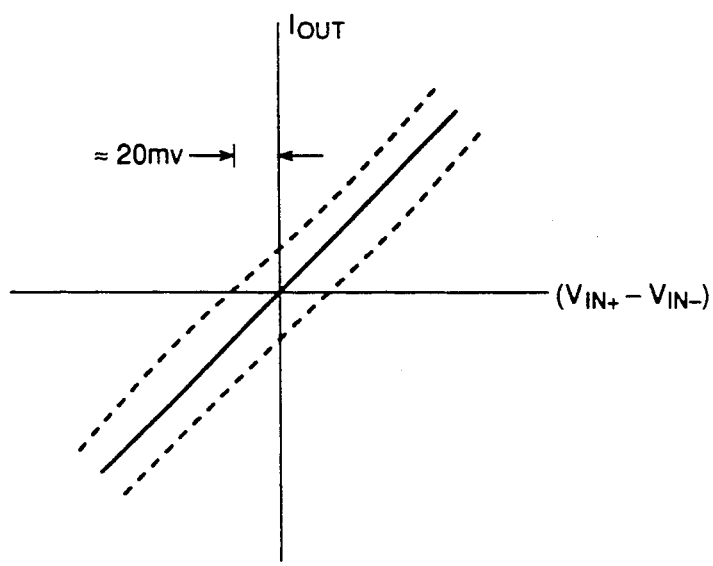
FIG. 9 is a graph of output current produced by the circuit of FIG. 8 as a function of differential input voltage, showing the range of offset produced by the circuit.

FIG. 9 is a graph of the current output of the circuit of FIG. 8 as a function of the differential input voltage. The solid line represents the ideal transfer curve and, like the transfer function of the circuit of FIG. 6, is seen to be a linear function of the differential input voltage. For a typical fabrication process, the matching between the bipolar current source transistors of the circuit of FIG. 8 is much better than the matching of the MOS transistors of the circuit of FIG. 6. The actual linear output transfer characteristic of any individual circuit is therefore typically limited by the offset voltages of the MOS input transistors, and may lie anywhere between the two dashed lines of FIG. 7, assuming an offset between the two input transistors of about 20 mV. From FIG. 9, it can be seen that the output is more tightly controllable than is the output of the circuit of FIG. 6, and will have much lower noise because of the lower noise current of the bipolar current source transistors.

Figure 10:
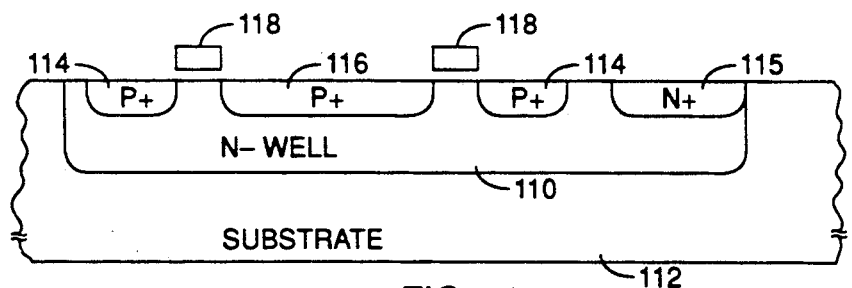
FIG. 10 is a cross sectional view of a typical lateral PNP transistor useable in the circuit of FIG. 8.

Referring now to FIG. 10, a cross sectional view of a typical lateral PNP transistor useable in the circuit of FIG. 8, n-well 110, fabricated using conventional CMOS technology, forms the base of the transistor in p-type substrate 112. An annular p-type region 114 acts as the collector of the transistor and is formed in n-well 110 by conventional processing steps. The annular collector 114 is spaced apart from and surrounds p-type emitter region 116, also formed in n-well 110 using conventional semiconductor processing techniques. Annular gate member 118 is formed above and insulated from the surface of n-well 110 and determines the self-aligned spacing of p-type collector and emitter regions 114 and 116. Base contact 115 is formed in n-well 110 using conventional processing techniques. Annular p-type region, p-type emitter region 116 and base contact 115 may be formed during the p and n source/drain diffusion steps in a conventional CMOS process. During operation of the circuit, a voltage at least a positive as the emitter voltage is placed on gate 118 and causes the surface under the gate to accumulate electrons, which prevents surface recombination of injected minority holes.

Figure 11:
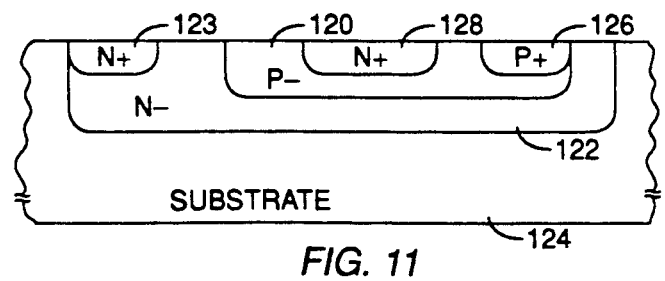
FIG. 11 is a cross sectional view of a typical vertical NPN transistor useable in the circuit of FIG. 8.

FIG. 11 is a cross sectional view of a typical vertical NPN transistor useable in the circuit of FIG. 8. P-type base region 120 is formed in collector n-well region 122 in p-type substrate 124 using conventional processing techniques. P-type base contact region 126 and n-type emitter region 128 are likewise conventionally formed in p-type base region 120, and n-type base contact 123 is formed in n-well 122, using the p and n type source/drain diffusions of the CMOS process.

As those of ordinary skill in the art will recognize from an examination of FIGS. 10 and 11, the circuit of FIG. 8 can be fabricated using a standard n-well CMOS process requiring in addition only the steps necessary to form p-type base region 120.

Figure 12:
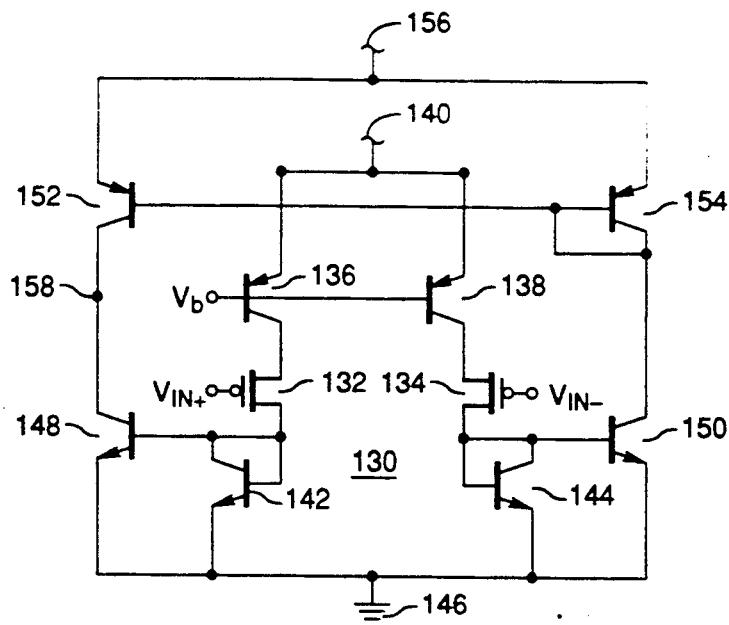
FIG. 12 is a schematic diagram of a presently preferred embodiment of a wide range differential amplifier according to the present invention.

Referring now to FIG. 12, a wide range linear differential voltage to current converter 130 according to the present invention is seen to be similar to the linear differential voltage to current converter of FIG. 8. P-channel input transistors 132 and 134 have their gates connected to non-inverting and inverting input voltage nodes $V_{in+}$ and $V_{in-}$ respectively, and have their sources connected to the collectors of PNP bias transistors 136 and 138. PNP transistors 136 and 138 are preferably lateral PNP transistors, which have a larger Early effect. The emitters of bias transistors 136 and 138 are commonly connected to a common voltage node 140, which may be a fixed voltage point or a derived voltage. The bases of bias transistors 136 and 138 are commonly connected to a source of fixed bias voltage $V_b$.

The drains of P-channel input transistors 132 and 134 are connected to the bases and collectors of NPN transistors 142 and 144. The emitters of transistors 142 and 144 are connected to a first fixed voltage source 146 (shown as ground).

The drains of P-channel input transistors 132 and 134 are also connected to the bases of NPN transistors 148 and 150, whose emitters are connected to the second voltage source 146. The collectors of NPN transistors 148 and 150 are connected to the collectors of PNP current mirror transistors 152 and 154. The bases of current mirror transistors 152 and 154 are connected together to the collector of PNP transistor 154. The emitters of PNP transistors 152 and 154 are connected to a second fixed voltage source, shown in FIG. 12 as the voltage rail 156. In one presently contemplated embodiment of the invention, common voltage node 140 and second fixed voltage source 156 may be the same point (shown by line 159, an optional connection between common voltage node 140 and the second fixed voltage source at voltage rail 156), but it is presently preferred that common voltage node 140 be independent since this allows for common voltage node 140 to be a derived voltage.

The output current of the circuit of FIG. 12 is taken from the node 158 formed by the common connection of the collectors of PNP transistor 152 and NPN transistor 148. The circuit of FIG. 12 operates in the same manner as that of FIG. 8, with a wider permissible range of output voltage.

Figure 13:
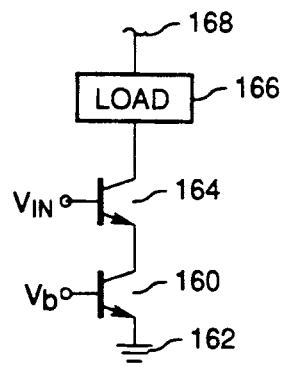
FIG. 13 is a schematic diagram of an embodiment of the present invention using all bipolar technology.
Figure 14:
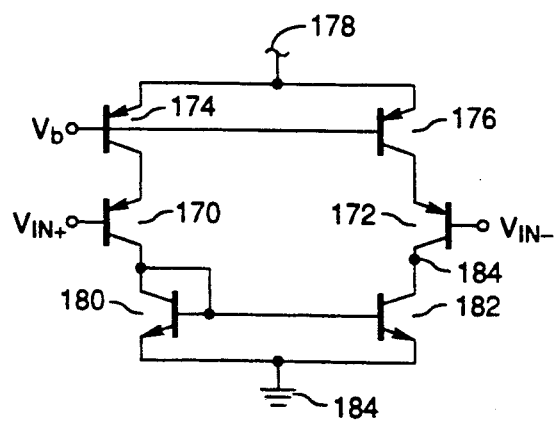
FIG. 14 is an embodiment of the present invention similar to the embodiment of FIG. 8 but utilizing bipolar technology.

If the infinite input impedance provided by MOS input transistors is not required, bipolar input transistors of the same carrier type may be used in their place, as shown in FIGS. 13 and 14.

FIG. 13 shows an all bipolar circuit identical in function to the circuit disclosed in FIG. 3. Lateral NPN current source transistor 160 has its base connected to a source of fixed bias voltage $V_b$, its emitter connected to a common voltage node 162 shown as ground in FIG. 13, and its collector connected to the emitter of NPN follower transistor 164. The base of NPN follower transistor 164 is connected to the input voltage $V_{in}$ and its collector is connected to a load 166. The other end of load 166 is returned to a fixed voltage source 168 shown as a voltage rail. Because of the use of all bipolar transistors, the circuit of FIG. 13 will have a lower offset voltage and lower noise than the circuit of FIG. 3.

Referring now to FIG. 14, it may be seen that the circuit disclosed therein is identical to the circuit of FIG. 8, with the exception of the substitution of PNP input transistors in place of the P-channel MOS input transistors. PNP input transistors 170 and 172 have their gates connected to non-inverting and inverting input voltage nodes $V_{in+}$ and $V_{in-}$ respectively, and have their emitters connected to the collectors of PNP bias transistors 174 and 176. PNP bias transistors 174 and 176 are preferably lateral PNP transistors, which have a larger Early effect. The emitters of bias transistors 174 and 176 are commonly connected to a first voltage source 178, shown symbolically as a voltage rail. The bases of PNP bias transistors 174 and 176 are commonly connected to a source of fixed bias voltage $V_b$.

The collectors of PNP input transistors 170 and 172 are connected to the collectors of current mirror connected NPN transistors 180 and 182. The emitters of transistors 180 and 182 are connected to a second voltage source 184 (shown as ground) negative with respect to the first voltage source 178.

The output current of the circuit of FIG. 14 is taken from the node 184 formed by the common connection of the collector of PNP input transistor 172 and NPN transistor 182.

While a presently-preferred embodiment of the invention has been disclosed, those of ordinary skill in the art will, from an examination of the within disclosure and drawings be able to configure other embodiments of the invention. For example, those of ordinary skill in the art will realize that the conductivity types of all transistors may be switched and the power supply voltages reversed, resulting in functionally equivalent circuits. These and other embodiments are intended to fall within the scope of the present invention, which is to be limited only by the scope of the appended claims.

What is claimed is:

1. A circuit for producing an output current which is a linear function of an input voltage, including:
    a voltage input node,
    a current output node,
    a source of bias voltage,
    a common voltage node,
    a first MOS transistor of a characteristic conductivity type having its gate connected to said input voltage node and its drain connected to said current output node,
    a second MOS transistor of the same characteristic conductivity type as said first MOS transistor, having its gate connected to said source of bias voltage, its drain connected to the source of said first MOS transistor and its source connected to said common voltage node, and
    means for maintaining said first MOS transistor in saturation
    said source of bias voltage having a magnitude less than the threshold voltage of said second MOS transistor.

2. The circuit of claim 1 wherein said MOS transistors are N-channel MOS transistors.

3. A circuit for producing an output current which is a linear function of an input voltage, including:
    a voltage input node,
    a current output node,
    a source of bias voltage,
    a common voltage node,
    a MOS transistor of a characteristic conductivity type having its gate connected to said input voltage node and its drain connected to said current output node,
    a lateral bipolar transistor of the same characteristic conductivity type as said MOS transistor, having its base connected to said source of bias voltage, its collector connected to the source of said MOS transistor and its emitter connected to said common voltage node, and means for maintaining said MOS transistor in saturation said bias voltage having a magnitude such that the current through said bipolar transistor maintains said MOS transistor in its subthreshold operating region.

4. The circuit of claim 3 wherein said MOS transistor is an N-channel MOS transistor and said bipolar transistor is an NPN transistor.

5. A circuit for producing a differential output current which is a linear function of a differential input voltage, including:
- a first voltage input node,
- a second voltage input node,
- a first current output node,
- a second current output node,
- a source of bias voltage,
- a common voltage node,
- a first MOS transistor of a characteristic conductivity type having its gate connected to said first input voltage node and its drain connected to said first current output node,
- a second MOS transistor of said characteristic conductivity type having its gate connected to said source of bias voltage, its drain connected to the source of said first MOS transistor and its source connected to said common voltage node,
- a third MOS transistor of said characteristic conductivity type having its gate connected to said second input voltage node and its drain connected to said second current output node,
- a fourth MOS transistor of said characteristic conductivity type having its gate connected to said source of bias voltage, its drain connected to the source of said third MOS transistor and its source connected to said common voltage node, and
- means for maintaining said first and third MOS transistors in saturation said bias voltage having a magnitude less than the threshold voltage of said second and fourth MOS transistors.

6. The circuit of claim 5 wherein said MOS transistors are N-channel MOS transistors.

7. The circuit of claim 5 wherein said MOS transistors are P-channel MOS transistors.

8. A circuit for producing a differential output current which is a linear function of a differential input voltage, including:
- a first voltage input node,
- a second voltage input node,
- a first current output node,
- a second current output node,
- a source of bias voltage,
- a common voltage node,
- a first MOS transistor of a characteristic conductivity type having its gate connected to said first input voltage node and its drain connected to said first current output node,
- a first bipolar transistor of the same characteristic conductivity type as said first MOS transistor, having its base connected to said source of bias voltage, its collector connected to the source of said first MOS transistor and its emitter connected to said common voltage node,
- a second MOS transistor of the same conductivity type as said first MOS transistor having its gate connected to said second input voltage node and its drain connected to said second current output node,
- a second bipolar transistor of the same conductivity type as said first bipolar transistor having its base connected to said source of bias voltage, its collector connected to the source of said second MOS transistor and its emitter connected to said common voltage node, and
- means for maintaining said first and second MOS transistors in saturation said bias voltage having a magnitude such that the current through said first and second bipolar transistors maintain said first and second MOS transistors in their subthreshold operating region.

9. The circuit of claim 8 wherein said MOS transistors are N-channel MOS transistors and said bipolar transistors are NPN transistors.

10. The circuit of claim 8 wherein said MOS transistors are P-channel MOS transistors and said bipolar transistors are PNP transistors.

11. A circuit for producing a differential output current which is a linear function of a differential input voltage, including:
- a first voltage input node,
- a second voltage input node,
- a first current output node,
- a second current output node,
- a source of bias voltage,
- a common voltage node,
- a first MOS transistor of a characteristic conductivity type having its gate connected to said first input voltage node and its drain connected to said first current output node,
- a second MOS transistor of said characteristic conductivity type having its gate connected to said source of bias voltage, its drain connected to the source of said first MOS transistor and its source connected to said common voltage node,
- a third MOS transistor of said characteristic conductivity type having its gate connected to said second input voltage node and its drain connected to said second current output node,
- a fourth MOS transistor of said characteristic conductivity type having its gate connected to said source of bias voltage, its drain connected to the source of said third MOS transistor and its source connected to said common voltage node,
- a first load means connected to said first current output node, and
- a second load means connected to said second current output node, said first and second load means adapted to maintain said first and third MOS transistors in saturation said bias voltage having a magnitude less than the threshold voltage of said second and fourth MOS transistors.

12. The circuit of claim 11 wherein said MOS transistors are N-channel MOS transistors.

13. The circuit of claim 11 wherein said MOS transistors are P-channel MOS transistors.

14. A circuit for producing a differential output current which is a linear function of a differential input voltage, including:
- a first voltage input node,
- a second voltage input node, a first current output node, a second current output node, a source of bias voltage, a common voltage node, a first MOS transistor of a characteristic conductivity type having its gate connected to said first input voltage node and its drain connected to said first current output node, a first bipolar transistor of the same characteristic conductivity type as said first MOS transistor, having its base connected to said source of bias voltage, its collector connected to the source of said first MOS transistor and its emitter connected to said common voltage node, a second MOS transistor of the same conductivity type as said first MOS transistor having its gate connected to said second input voltage node and its drain connected to said second current output node, a second bipolar transistor of the same conductivity type as said first bipolar transistor having its base connected to said source of bias voltage, its collector connected to the source of said second MOS transistor and its emitter connected to said common voltage node, a first load means connected to said first current output node, and a second load means connected to said second current output node, said first and second load means adapted to maintain said first and second MOS transistors in saturation said bias voltage having a magnitude such that the current through said first and second bipolar transistors maintain said first and second MOS transistors in their subthreshold operating region.

15. The circuit of claim 14 wherein said MOS transistors are N-channel MOS transistors and said bipolar transistors are NPN transistors.

16. The circuit of claim 14 wherein said MOS transistors are P-channel MOS transistors and said bipolar transistors are PNP transistors.

17. The circuit of claim 14 wherein said first and second load means are diode-connected bipolar transistors.

18. A circuit for producing an output current which is a linear function of a differential input voltage, including:

a first voltage input node, a second voltage input node, a current output node, a source of bias voltage, a common voltage node, a first MOS transistor of a first conductivity type having its gate connected to said first input voltage node, a second MOS transistor of said first conductivity type having its gate connected to said source of bias voltage, its drain connected to the source of said first MOS transistor and its source connected to said common voltage node, a third MOS transistor of said first conductivity type having its gate connected to said second input voltage node and its drain connected to said current output node, a fourth MOS transistor of said first conductivity type having its gate connected to said source of bias voltage, its drain connected to the source of said third MOS transistor and its source connected to said common voltage node, a first MOS current mirror transistor of a second conductivity type opposite to that of said first conductivity type having its source connected to a fixed voltage source and its gate and drain connected to the drain of said first MOS transistor, and a second MOS current mirror transistor of said second conductivity type having its source connected to said fixed voltage source, its gate connected to the gate of said first MOS current mirror transistor, and its drain connected to the drain of said third MOS transistor said bias voltage having a magnitude less than the threshold voltage of said second and fourth MOS transistor of said first conductivity type.

19. The circuit of claim 18 wherein said first conductivity type MOS transistors are N-channel transistors and said second conductivity type MOS transistors are P-channel transistors.

20. A circuit for producing an output current which is a linear function of a differential input voltage, including:

a first voltage input node, a second voltage input node, a current output node, a source of bias voltage, a common voltage node, a first MOS transistor of a characteristic conductivity type having its gate connected to said first input voltage node, a first bipolar transistor of a first type having its base connected to said source of bias voltage, its collector connected to the source of said first MOS transistor and its emitter connected to said common voltage node, a second MOS transistor of said characteristic conductivity type having its gate connected to said second input voltage node and its drain connected to said current output node, a second bipolar transistor of said first type having its base connected to said source of bias voltage, its collector connected to the source of said second MOS transistor and its emitter connected to said common voltage node, a first bipolar current mirror transistor of a second type having its emitter connected to a fixed voltage source and its collector and base connected to the drain of said first MOS transistor, and a second bipolar current mirror transistor of said second type having its emitter connected to said fixed voltage source, its base connected to the base of said first bipolar current mirror transistor, and its collector connected to the drain of said second MOS transistor said bias voltage having a magnitude such that the current through said first and second bipolar transistors of said first type maintain said first and second MOS transistors in their subthreshold operating region.

21. The circuit of claim 20 wherein said MOS transistors are P-channel MOS transistors, said first conductivity type bipolar transistors are lateral PNP transistors and said second conductivity type bipolar transistors are NPN transistors.

22. A circuit for producing an output current which is a linear function of a differential input voltage, including:

a first voltage input node,
a second voltage input node,
a current output node,
a source of bias voltage,
a common voltage node,
a first MOS transistor of a first conductivity type having its gate connected to said first input voltage node,
a first bipolar transistor of said first conductivity type, having its base connected to said source of bias voltage, its collector connected to the source of said first MOS transistor and its emitter connected to said common voltage node,
a second MOS transistor of said first conductivity type, having its gate connected to said second input voltage node,
a second bipolar transistor of said first conductivity type having its base connected to said source of bias voltage, its collector connected to the source of said second MOS transistor and its emitter connected to said common voltage node,
a first bipolar current mirror transistor of a second conductivity type having its emitter connected to a first fixed voltage source and its collector and base connected to the drain of said first MOS transistor,
a second bipolar current mirror transistor of said second conductivity type having its emitter connected to said first fixed voltage source, its base connected to the base of said first bipolar current mirror transistor of said first type, and its collector connected said current output node,
a third bipolar current mirror transistor of said second conductivity type having its emitter connected to said first fixed voltage source and its collector and base connected to the drain of said second MOS transistor,
a fourth bipolar current mirror transistor of said second conductivity type having its emitter connected to said first fixed voltage source, and its base connected to the base of said third bipolar current mirror transistor of said second type,
a first bipolar current mirror transistor of said first conductivity type having its emitter connected to a second fixed voltage source and its collector and base connected to the collector of said fourth bipolar current mirror transistor of said second conductivity type, and
a second bipolar current mirror transistor of said first conductivity type having its emitter connected to said second fixed voltage source, its base connected to the base of said first bipolar current mirror transistor of said first conductivity type, and its collector connected said current output node
said bias voltage having a magnitude such that the current through said first and second bipolar transistors of said first conductivity type maintain said first and second MOS transistors in their subthreshold operating region.

23. The circuit of claim 22 wherein said first conductivity type MOS transistors are P-channel MOS transistors, said first conductivity type bipolar transistors are lateral PNP transistors, said second fixed voltage source and said common voltage node are the same, and said second conductivity type bipolar transistors are NPN transistors.

* * * * *